United States Patent [19]
Rostoker et al.

[11] Patent Number: 5,756,395
[45] Date of Patent: May 26, 1998

[54] PROCESS FOR FORMING METAL INTERCONNECT STRUCTURES FOR USE WITH INTEGRATED CIRCUIT DEVICES TO FORM INTEGRATED CIRCUIT STRUCTURES

[75] Inventors: Michael D. Rostoker, Boulder Creek; Ashok K. Kapoor, Palo Alto, both of Calif.

[73] Assignee: LSI Logic Corporation, Milpitas, Calif.

[21] Appl. No.: 516,614

[22] Filed: Aug. 18, 1995

[51] Int. Cl.$^6$ ................................ H01L 21/283
[52] U.S. Cl. .................. 438/622; 438/661; 438/667; 438/975
[58] Field of Search ........................ 437/189, 190, 437/208, 209, 195; 438/455, 462, 622, 661, 667, 975

[56] References Cited

U.S. PATENT DOCUMENTS

| | | | |
|---|---|---|---|
| 3,811,183 | 5/1974 | Celling | 29/588 |
| 4,489,478 | 12/1984 | Sakurai | 29/574 |
| 4,499,655 | 2/1985 | Anthony | 438/667 |
| 4,660,066 | 4/1987 | Reid | 357/30 |
| 4,818,728 | 4/1989 | Rai et al. | 437/209 |
| 4,825,284 | 4/1989 | Soga et al. | 357/80 |
| 5,166,097 | 11/1992 | Tanielian | 438/667 |
| 5,281,151 | 1/1994 | Arima et al. | 439/68 |
| 5,352,926 | 10/1994 | Andrews | 257/717 |
| 5,387,817 | 2/1995 | Ishikiriyama | 257/758 |
| 5,475,236 | 12/1995 | Yoshizaki | 257/48 |
| 5,475,264 | 12/1995 | Sudo et al. | 257/723 |
| 5,485,039 | 1/1996 | Fujita et al. | 257/774 |
| 5,508,561 | 4/1996 | Tago et al. | 257/737 |
| 5,510,655 | 4/1996 | Tanielian | 257/774 |
| 5,510,758 | 4/1996 | Fujita et al. | 333/247 |
| 5,615,477 | 4/1997 | Sweitzer | 29/840 |

FOREIGN PATENT DOCUMENTS

| | | |
|---|---|---|
| 0 374 971 | 12/1989 | European Pat. Off. . |
| 4-85961 | 3/1992 | Japan . |
| 5-243330 | 9/1993 | Japan . |
| 5-243482 | 9/1993 | Japan . |

OTHER PUBLICATIONS

Wolf, S., Silicon Processing, vol. 2, 1990, Lattice Press, pp. 176–189, 240–251, 258–259, 1990.

*Primary Examiner*—T. N. Quach
*Attorney, Agent, or Firm*—John P. Taylor

[57] ABSTRACT

A process for forming an integrated circuit structure is described wherein individual integrated circuit devices such as MOS or bipolar transistors are constructed on and in a semiconductor substrate and one or more layers of metal interconnects are constructed on and in a second substrate, preferably of similar thickness, and the two substrates are then aligned and bonded together to thereby provide electrical interconnections of individual integrated circuit devices on the semiconductor substrate with appropriate metal interconnects on the second substrate to provide the desired integrated circuit structure. The one or more layers of metal interconnects are formed on the second substrate by the steps of forming a pattern of metal contacts in the second substrate and level with the surface of the substrate; forming a metal layer over the substrate, preferably of a different metal than the metal contacts; patterning the metal layer to form vias; forming a first layer of dielectric material on the surface of the substrate over the exposed portions of the metal contacts and around the metal vias; forming a further metal layer over the first layer of dielectric material and the metal vias, preferably using a different metal than used for the metal vias; patterning the further metal layer into metal interconnects; and depositing a second layer of dielectric material over the exposed portions of the first layer of dielectric material and around the metal interconnects. In a preferred embodiment, over the uppermost metal layer is formed a layer of low melting alloy material (solder) prior to the step of patterning this metal layer to facilitate the electrical connection of the metal interconnect structure.

17 Claims, 8 Drawing Sheets

PROCESS FOR FORMING METAL INTERCONNECT STRUCTURES FOR USE WITH INTEGRATED CIRCUIT DEVICES TO FORM INTEGRATED CIRCUIT STRUCTURES

BACKGROUND OF THE INVENTION

1. Field of the Invention

This invention relates to a novel metal interconnect structure for use with integrated circuit devices in the formation of integrated circuit structures, and a process of making same. More particularly, this invention relates to a metal interconnect structure formed on a first substrate and then bonded to a second substrate which contains integrated circuit devices, and a process for making such structures.

2. Description of the Related Art

In the construction of VLSI integrated circuit structures, the formation of the active devices on/in the semiconductor substrate such as a silicon wafer involves the formation of multiple insulation and conductive layers, as well as temporary masking layers, and can involve numerous processing steps, including deposition, masking, doping, and etching steps. If a problem should arise during one of the processing steps which cannot be remedied, all of the previous processing steps may be adversely impacted, which can add considerably to the cost of the individual integrated circuit dies eventually obtained from the processed wafer, i.e., by lowering the yield. In addition, once the individual integrated circuit devices, such as MOS and bipolar transistors, are formed on/in the semiconductor substrate, they must be electrically connected or "wired" to other devices to form the desired electrical circuitry comprising the integrated circuit structure, i.e., additional processing steps must be performed to construct the "wiring" structure.

Furthermore, while previous simpler structures might have only required a single layer of metal interconnects between bonding pads on the surface of the chip or die and the individual connections to the elements of each active device, e.g., the source, drain, and gate electrodes of an MOS transistor, it is not uncommon for three or four or more metal interconnect layers to be utilized with VLSI integrated circuit structures. This, in turn, requires separation of each layer of metal interconnects from adjacent metal layers using insulating layers through which openings or vias are selectively cut and then filled with metal to provide electrical connections, when needed, between the metal interconnects on one layer and metal connects on an adjacent layer. Complete filling of such openings with metal and the formation of metal to metal bonding between the metal in the opening and the underlying and overlying metal interconnects to insure electrical connection therebetween has created further problems.

Thus, even when the individual integrated circuit devices are flawlessly constructed on and in the semiconductor substrate, a mistake or problem occurring during the construction of the metal interconnect layers can result in damage to the structure which will result in the need to salvage the entire substrate or wafer, or at least increase the defect rate of chips formed from each such substrate or wafer, i.e., reduce the yield. It would, therefore, be highly desirable to separate or segregate the construction of the metal interconnect layers from the prior construction of the integrated circuit devices in and on the semiconductor substrate.

In the past, structures have been proposed or built wherein one or more chips were mounted to a multilayer ceramic structure having a series of metal interconnects formed on each ceramic layer to thereby electrically interconnect, for example, a series of individual chips to form the desired electrical circuit. Such a multilayer ceramic mounting structure also served as a heat dissipating medium for the heat generated during the operation of each individual chip.

However, such ceramic bases or mounting pads were bulky and cumbersome and did not lend themselves to incorporation into the individual packaging of the integrated circuit chip or die itself, but rather served, at least in some instances, merely as a heat dissipating printed circuit mounting board to which a series of integrated circuit chips were mounted.

It would, therefore, be advantageous to provide a separate construct for the metal interconnect layers used to electrically connect the individual integrated circuit (semiconductor) devices formed on a semiconductor substrate to form the desired integrated circuit structure comprising the chip or die.

SUMMARY OF THE INVENTION

The invention comprises an integrated circuit structure wherein individual integrated circuit devices such as MOS or bipolar transistors are constructed on and in a semiconductor substrate and one or more layers of metal interconnects are constructed on and in a second substrate, preferably of similar thickness, and the two substrates are then aligned and bonded together to thereby provide electrical interconnections of individual integrated circuit devices on the semiconductor substrate with appropriate metal interconnects on the second substrate to provide the desired integrated circuit structure without, however, contributing unduly to the overall size of the integrated circuit structure comprising the die or chip.

In accordance with the invention, the one or more layers of metal interconnects are formed on the second substrate by the steps of forming a pattern of metal contacts in the second substrate and level with the surface of the substrate; forming a metal layer over the substrate, preferably of a different metal than the metal contacts; patterning the metal layer to form vias; forming a first layer of dielectric material on the surface of the substrate over the exposed portions of the metal contacts and around the metal vias; forming a further metal layer over the first layer of dielectric material and the metal vias, preferably using a different metal than used for the metal vias; patterning the further metal layer into metal interconnects; and depositing a second layer of dielectric material over the exposed portions of the first layer of dielectric material and around the metal interconnects. If desired, the steps of forming the vias and the layer of metal interconnects (as well as the associated dielectric layers) may be repeated as many times as desired or needed to form the desired number of metal interconnect layers for the needed wiring structure. In a preferred embodiment, over the uppermost metal layer is formed a layer of low melting alloy material (solder) prior to the step of patterning this metal layer to facilitate the electrical connection of the metal interconnect structure to a corresponding structure of integrated circuit (semiconductor) devices formed on a semiconductor substrate, which may also be formed with a low melting alloy material (solder) formed on contact pads thereon aligned with the uppermost metal interconnects on the second substrate. Various types and configurations of holes or openings may be formed through the second substrate to provide electrical contact from the metal wiring structure to the opposite surface of the substrate, as well as to facilitate alignment of the second substrate with the semiconductor substrate prior to bonding of the two substrates together. Such openings or holes may further serve to permit ancillary or alternate functions as well, such as increasing the gettering effect, providing channels for the circulation of coolant in contact with the substrate, reducing the overall weight of the substrate, providing better heat dissipation, providing a more controlled thermal expansion of the substrate by the patterns of the holes, and permitting formation of contact regions from the backside of the substrate for test purposes.

DETAILED DESCRIPTION OF THE INVENTION

The invention comprises an integrated circuit structure and process wherein individual integrated circuit devices such as MOS or bipolar transistors are constructed on and in a semiconductor substrate and one or more layers of metal interconnects are constructed on and in a second substrate, preferably of similar thickness, and the two substrates are then aligned and bonded together to thereby provide electrical interconnections of individual integrated circuit devices on the semiconductor substrate with appropriate metal interconnects on the second substrate to provide the desired integrated circuit structure, prior to the slicing of individual dies or chips from the resulting substrate "sandwich".

Such an integrated structure constructed in accordance with the invention may find utility in any electrical/ electronic system using "IC's" or integrated circuit substrates. Thus, the structure and process of the present invention may be utilized in system level products comprising single chip modules (SCM) often including other electrical components (such as capacitors, resistors, inductors, etc.); multi-chip modules (MCM) having at least two integrated circuit die in the same or separate packages, with or without other electrical components; board level products (BLP) such as those having multiple integrated circuits on printed wiring board(s) (PWB); and box level products (Boxes) which may include a combination of elements from the list of SCM, MCM, BLP, and the like. One or more of such SCM, MCM, PWB, or BLP's may act as, or be integrated into a functional system or subsystem. The system level products contemplated include digital data storage; security and surveillance systems, general purpose computers (such as personal computers, work stations, servers, mini computers, mainframe computers and super computers); digital audio and video compression and transmission; transportation vehicles (such as airplanes, trains, automobiles, helicopters, rockets, missiles, boats, submarines, and the like); subsystems utilized in such vehicles (such as navigational positioning, i.e., Global Positioning System (GPS), navigational displays and controllers, hazard avoidance such as radar and sonar, fly by wire control, and digital engine control and monitoring); entertainment systems (such as digital television and radio, digital cameras, audio and video recorders, compact disc players, digital tape, or the like); and communications (such as PBX, telephone switching, voice mail, auto attendant, network controllers, video teleconferencing, digital data transmission (such as token ring, ethernet, ATM, or the like)); and subsystems or subassemblies for inclusion or attachment to more complex system level products.

Figure 1:
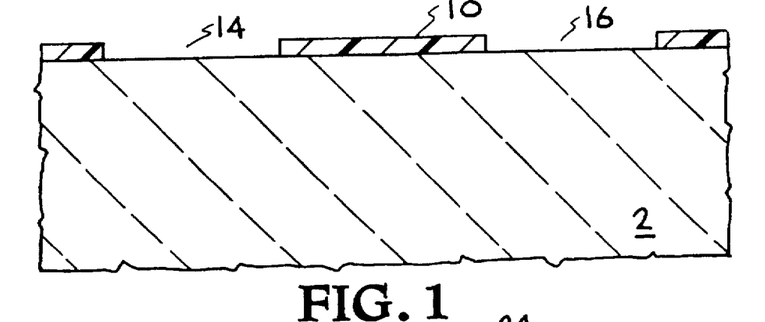
FIG. 1 is a fragmentary vertical cross-sectional view of a substrate used for forming the metal interconnect layer(s) thereon showing a mask formed thereon with openings corresponding to the metal interconnects and/or contact pads for the uppermost metal layer of the desired integrated circuit structure.

Turning now to FIG. 1, a substrate which will be used to carry the metal interconnects is shown at 2. For convenience, substrate 2 may comprise a silicon wafer of approximately the same diameter as the semiconductor wafer on which the integrated circuit devices will be constructed. Alternatively, substrate 2 may comprise an insulation material chosen for maximum heat dissipation. However, in a preferred embodiment, the thickness of substrate 2, regardless of the type of material, will preferably not exceed the thickness of a conventional semiconductor substrate or wafer, e.g., about 500 microns, to avoid unduly adding to the bulk of the finished structure.

When a conventional silicon wafer, such as utilized in the construction of integrated circuit structures, is used as the metal interconnect substrate, it is preferable to use a silicon wafer having a crystallographic face orientation of (110) to permit anisotropic wet etching of openings through the substrate, since wet etching is faster than dry etching while still etching anisotropically due to the use of a (110) face silicon substrate.

As further shown in FIG. 1, on the surface of substrate 2 is formed a mask 10 such as a photoresist mask, having representative openings 14 and 16 therein corresponding dimensionally to portions of the uppermost patterned metal layer which would be formed in a conventional structure. This patterned metal layer, therefore, could comprise both metal interconnects and contact pads for the attachment of external leads, or simply contact pads from a lower metal interconnect layer connected to the pads through metal-filled vias, as will be described below.

Figure 2:
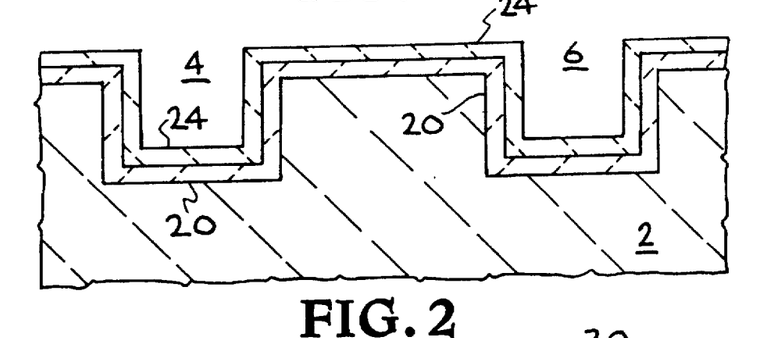
FIG. 2 is a fragmentary vertical cross-sectional view showing the structure of FIG. 1 after the step of etching of slots in the substrate corresponding to the metal interconnects and/or contact pads for the uppermost metal layer of the desired integrated circuit structure, and showing two layers of barrier material lining the exposed surfaces of the slots.

Turning to FIG. 2, illustrative slots 4 and 6 are shown etched in substrate 2 through openings 14 and 16 in mask 10. The lateral dimensions of slots 4 and 6, which are only illustrative of a series of metal contact pads or interconnects, will vary depending upon the desired size and pattern of the metal interconnects or pads to be formed. The depth of openings 4 and 6 will equal the thickness of the desired metal interconnects or pads, e.g., from about 0.5 microns to about 5 microns plus about 0.1 to about 0.2 microns (when necessary) to permit the formation of one or more barrier layers between substrate 2 and the metal interconnects or pads to be formed in slots 4 and 6, as will be described below. Any conventional etching system may be used to form slots 4 and 6 which will provide an anisotropic etch of substrate 2 to form slots 4 and 6 with sidewalls substantially perpendicular to the surface of substrate 2.

As shown in FIG. 2, one or more barrier layers 20 and 24 may be formed on the surfaces of slots 4 and 6, for example by a blanket deposition. The use of one or more barrier layers is preferred when substrate 2 comprises a conductive material or a semiconductor material such as silicon. The use of one or more barrier layers to line the surfaces of slots 4 and 6 may also be useful to provide etch stops during subsequent etching steps as will be described below. First barrier layer 20 may comprise, for example, a silicon oxide or silicon nitride barrier layer, particularly when substrate 2 comprises a silicon wafer. Second barrier layer 24 may comprise a material compatible with the metal which will be used to fill slots 4 and 6. Thus, in the illustrated embodiment, second barrier layer 24 may comprise titanium nitride. The thickness of each barrier layer may range from about 0.05 to about 0.15 microns and typically will be about 0.1 microns. Thus, if both barrier layers are formed over the surfaces of slots 4 and 6, the depth of slots 4 and 6 should be about 0.2 microns greater than the desired thickness of the metal to be used to fill slots 4 and 6, while the lateral dimensions of slots 4 and 6 should be about 0.4 microns greater than desired lateral dimensions of the metal pads or interconnects to be formed in slots 4 and 6.

Figure 3:
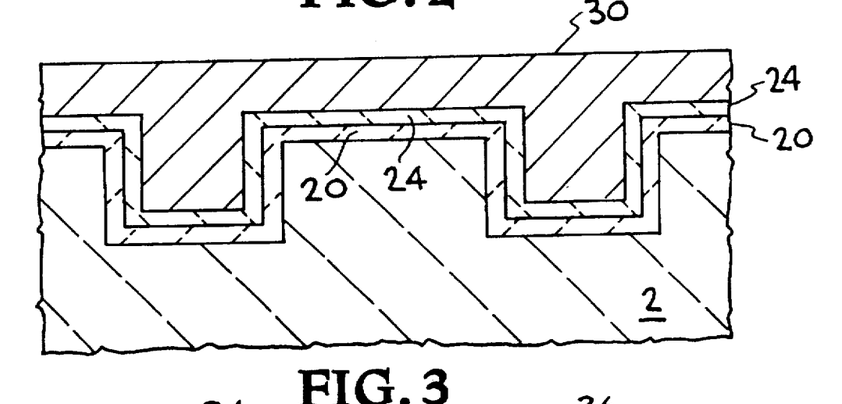
FIG. 3 is a fragmentary vertical cross-sectional view showing the structure of FIG. 2 after deposition of a first metal layer over the structure which fills the lined slots with metal.

A blanket deposition of a first metal layer 30, such as aluminum, which will form the metal contact pads and/or the topmost layer of metal interconnects, is then formed over the structure, as shown in FIG. 3. First metal layer 30 may comprise any metal which will be compatible with other materials used in the structure. Examples of other metals which could be used in the formation of metal layer 30 include gold or any of the six platinum metals, i.e., Ru, Rh, Pd, Os, Ir, or Pt. Any convenient deposition method can be used, including chemical vapor deposition (CVD), physical vapor deposition (PVD), e.g., sputtering, or electroplating.

Figure 4:
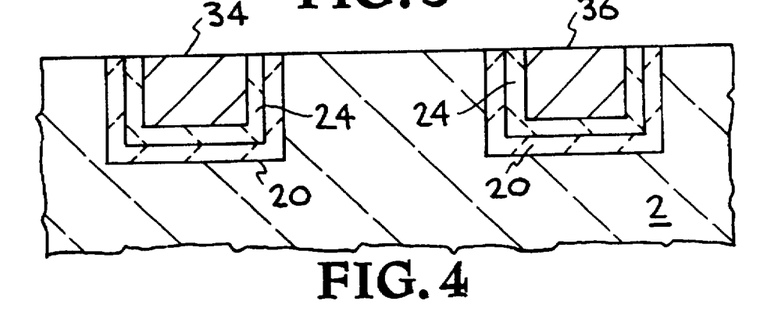
FIG. 4 is a fragmentary vertical cross-sectional view showing the structure of FIG. 3 after planarization to remove all of the first metal layer on the surface of the substrate leaving only the metal deposited in the slots.

After the deposition of metal layer 30, the structure is planarized, for example, by a chemical/mechanical polishing, to remove all of metal layer 30, as well as barrier layer 20 and 24 on the surface of substrate 2, leaving only those portions of metal layer 30 and barrier layers 20 and 24 which were formed in slots 4 and 6, as shown in FIG. 4. Alternatively, only the surface portions of metal layer may be removed, if desired, leaving the surface portions of barrier layers 20 and 24 on the surface of substrate 2; or the surface portions of barrier layer 24 may be removed with metal layer 30, leaving only barrier layer 20 on the surface of substrate 2. The choice of how many layers will be removed during the planarization step will be influenced by the etching system used to pattern second metal layer 40 which is now formed over the upper surface of the structure, i.e., formed over substrate 2 if all of the surface portions of metal layer 30 and barrier layers 20 and 24 are removed. In the illustrated embodiment shown in FIG. 5, second metal layer 40 is shown deposited over substrate 2, as well as over metal portions 34 and 36 of metal layer 30 remaining in slots 4 and 6.

Figure 5:
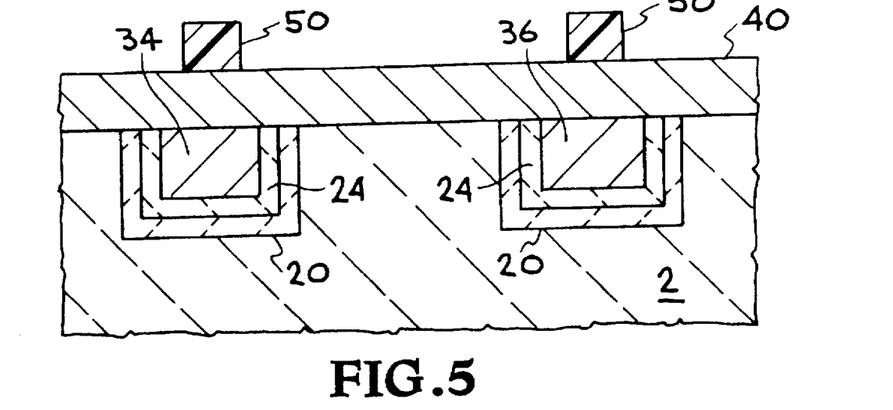
FIG. 5 is a fragmentary vertical cross-sectional view showing the structure of FIG. 4 after deposition thereon of a second metal layer from which the metal filler for the vias will be formed, and also showing a mask formed over the portions of the metal which will comprise the metal filler material of the vias.

Second metal layer 40 will be used to form metal vias extending upwardly from patterned portions 34 and 36 of metal layer 30 to a further layer of metal interconnects to be subsequently formed thereover. Second metal layer 40 should, therefore, comprise a metal compatible with metal layer 30, as well as with any metal layer to be subsequently deposited thereon to form a further metal interconnect layer. However, it is preferred that metal layer 40 comprise a different metal than metal layer 30 to permit a selective etch of metal layer 40 to pattern it without, however, etching underlying metal layer 30. When metal layer 30 comprises aluminum, metal layer 40 may comprise tungsten. Other metals which could be used to form metal 40 include, for example, molybdenum, titanium, and tantalum.

Figure 6:
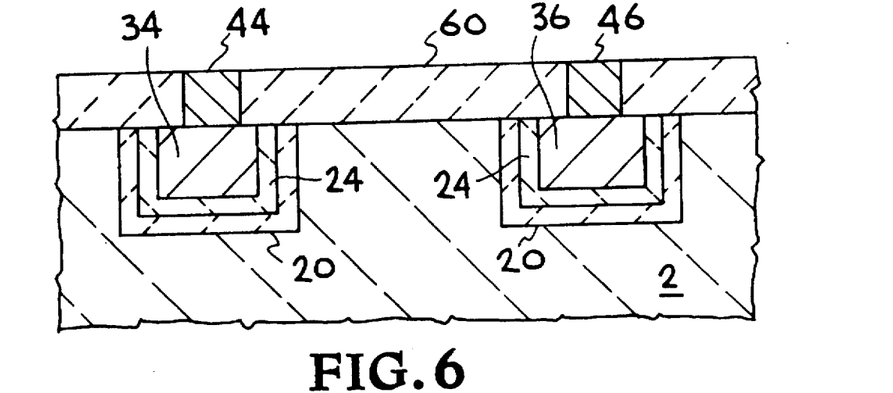
FIG. 6 is a fragmentary vertical cross-sectional view showing the structure of FIG. 5 after etching of the unmasked portions of the second metal layer to form the metal vias, and after deposition of a first insulating layer over the substrate and around the metal-filled vias, and after the surface is planarized to expose the top of the metal-filled vias.

Mask 50 is now formed over second metal layer 40 to define the metal-filled vias which will be formed by patterning metal layer 40, as also shown in FIG. 5. Mask 50 may comprise the same mask material such as used for mask 10, e.g., a photoresist mask. Metal layer 40 is then etched, resulting in the formation of metal-filled vias 44 and 46, and mask 50 is removed. Insulating material 60, such as silicon oxide, is then deposited over the exposed portions of substrate 2 and metal contacts 34 and 36 to fill the regions around metal-filled vias 44 and 46. The structure is then planarized to expose the upper surfaces of metal-filled vias 44 and 46, resulting in the structure shown in FIG. 6, using any of the conventional planarization techniques, including chemical and/or mechanical polishing. Metal-filled vias 44 and 46 will usually vary in diameter from the minimum dimensions allowed by lithography up to any larger diameter needed.

Figure 7:
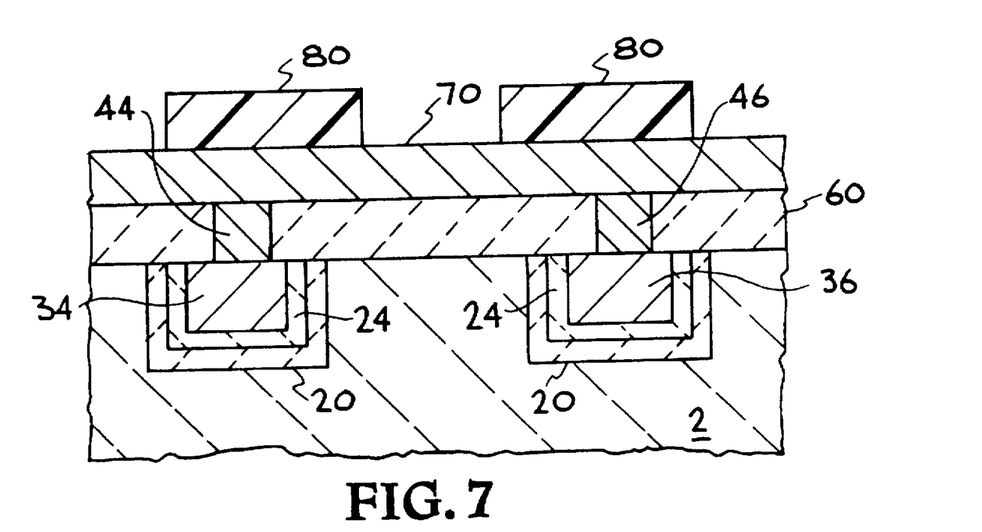
FIG. 7 is a fragmentary vertical cross-sectional view showing the structure of FIG. 6 after deposition of a third metal layer over the structure and a mask formed over the third metal layer to define metal interconnects to be formed from the third metal layer.
Figure 8:
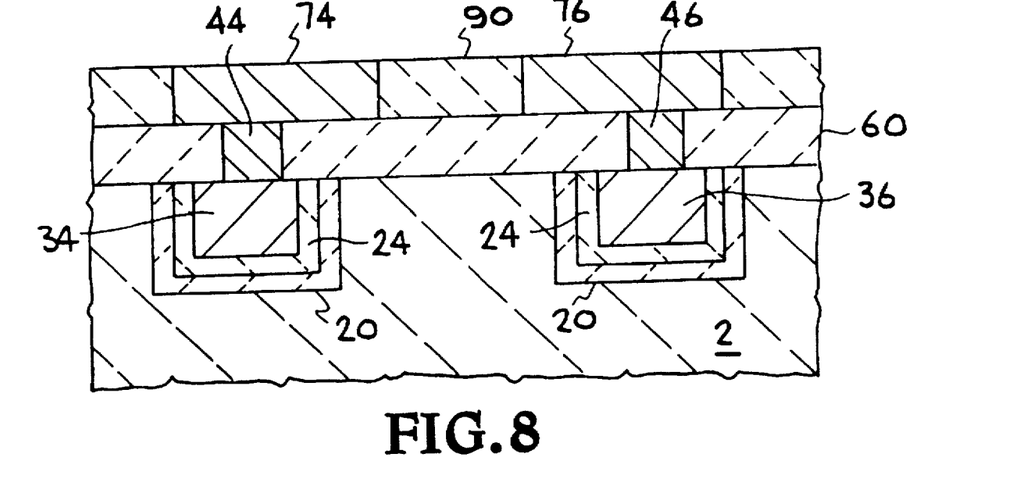
FIG. 8 is a fragmentary vertical cross-sectional view showing the structure of FIG. 7 after the etching of the third metal layer to form the metal interconnects, the mask removed, a second insulating layer deposited into those regions where the third metal layer was removed, and a planarization carried out to smooth the second insulating layer down to the level of the metal interconnects.

Turning now to FIG. 7, a further metal layer 70 is now formed over metal-filled vias 34 and 36 and a mask 80 is formed over metal layer 70 in preparation for patterning metal layer 70 to form metal interconnects 74 and 76, as shown in FIG. 8. Metal layer 70 will preferably comprise a different metal from metal-filled vias 44 and 46. For example, when metal-filled vias 44 and 46 are formed from tungsten metal, metal layer 70 may comprise an aluminum metal. Metal layer 70 is then etched, for example, using an anisotropic dry etch with chlorine chemistry, to form metal interconnects 74 and 76. After patterning metal layer 70 to form metal interconnects 74 and 76, mask 80 is removed and insulating material 90, such as another layer of silicon oxide, is deposited over insulation 60 and around metal interconnects 74 and 76. The structure is then planarized, e.g., by chemical/mechanical polishing, to provide the structure shown in FIG. 8 having the top surfaces of metal interconnects 74 and 76 exposed, and the regions between metal interconnects 74 and 76 filled with insulating material 90, and flush with the top surfaces of metal interconnects 74 and 76.

While metal interconnects 74 and 76 could comprise the only layer of metal interconnects below metal contacts 34 and 36 (after substrate 2 is inverted and mounted to a substrate containing integrated circuit devices), in most instances one or more further layers of metal interconnects will also be formed on the structure, as will now be described. Thus, the formation of a thin layer of low melting metal alloy (solder) over the top surface of the metal interconnects will not be described at this point, but will be described below with respect to the structure illustrated in FIGS. 11–13 below, it being understood that the structure to be described at that point may be used with respect to any layer of metal interconnects or metal pads destined to be the layer which will be bonded to the substrate having the integrated circuit devices formed thereon.

Figure 9:
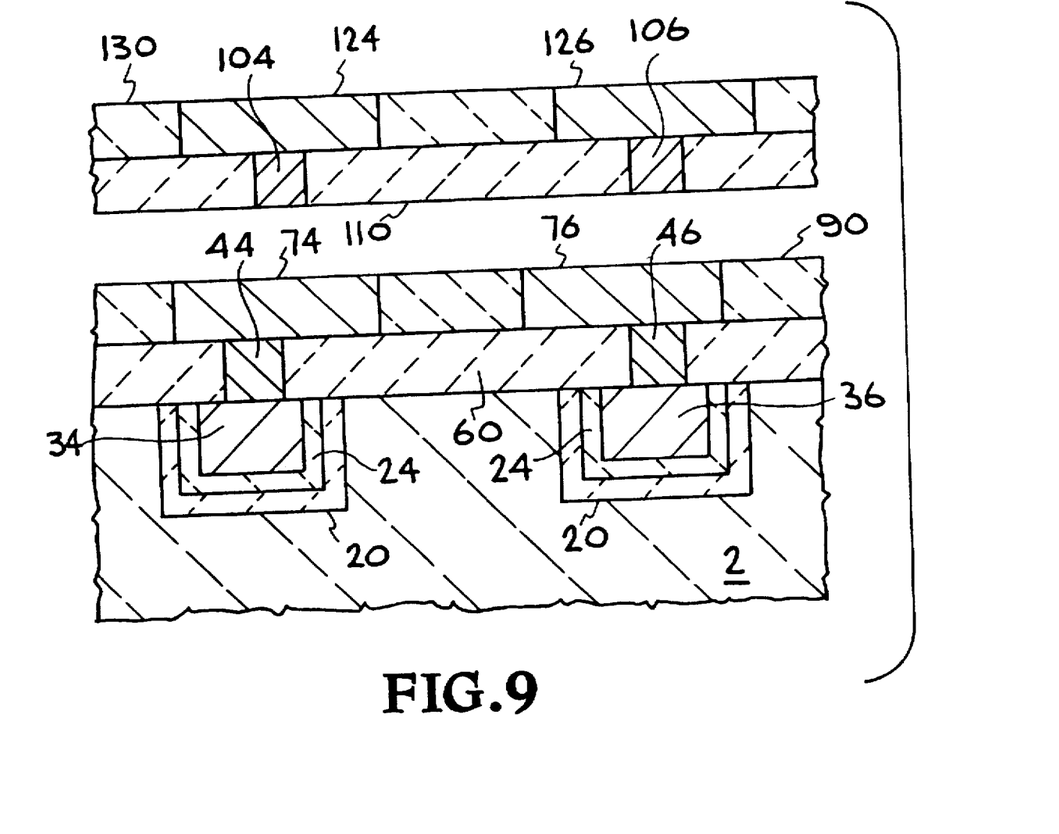
FIG. 9 is a fragmentary and partially exploded vertical cross-sectional view showing the structure of FIG. 8 after repeating the steps illustrated in FIG. 5-8 to thereby form another layer of vias and another layer of metal interconnects in electrical contact with the underlying metal interconnects and vias.

As shown in the partially exploded view of FIG. 9, when at least two layers of metal interconnects are desired, in addition to the metal interconnects/pads formed in slots 4 and 6, a further series of layers of metal-filled vias, insulating layers, and metal interconnects can be formed over metal interconnects 74 and 76 and insulating layer 90 using the same construction techniques described above with respect to FIGS. 5–8. Thus, as illustrated in FIG. 9, a further metal layer suitable for forming the metal-filled vias is deposited over metal interconnects 74 and 76 and insulating material 90, e.g., a tungsten metal layer. The metal layer is then masked and patterned to form metal-filled vias 104 and 106, after which insulating material 110 is deposited in the regions over insulating material 90 and metal interconnects 74 and 76 between metal-filled vias 104 and 106. The structure is then polished (as previously described with respect to insulating layer 60 and metal-filled vias 44 and 46) and a further layer of metal, such as aluminum, is then deposited over the planar structure, masked, and then patterned to form metal interconnects 124 and 126, as shown in FIG. 9. Deposition of insulating material 130 and planarizing of the top surfaces of insulating material 130 and metal interconnects 124 and 126 complete formation of this further series of layers of vias and metal interconnects.

Figure 10:
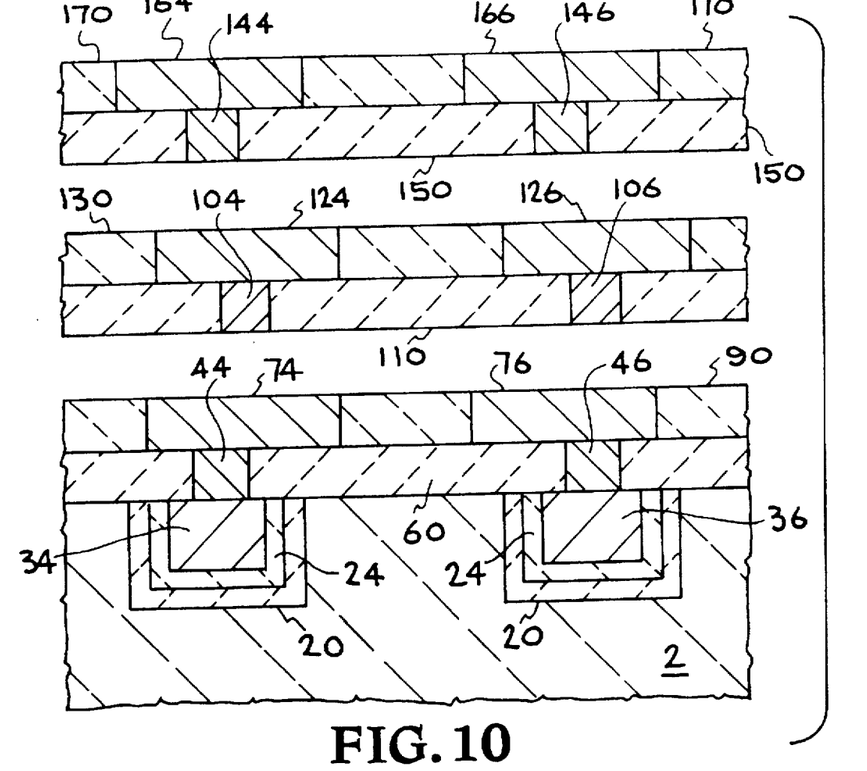
FIG. 10 is a fragmentary partially exploded vertical cross-sectional view showing the structure of FIG. 9 after again repeating the steps illustrated in FIG. 5-8 to thereby form a further layer of vias and yet another layer of metal interconnects in electrical contact with underlying portions of the metal interconnect/via wiring structure.

The partially exploded view of FIG. 10 shows yet another series of metal-filled vias and metal interconnect layers formed over the structure in the same manner as just described. Thus, a further metal layer suitable for forming metal-filled vias, such as tungsten, is deposited over metal interconnects 124 and 126 and insulating material 110, then masked, and patterned to form metal-filled vias 144 and 146, after which insulating material 150 is deposited in the regions over insulating material 130 and metal interconnects 124 and 126 between metal-filled vias 144 and 146. The structure is then polished, as previously described, and a further layer of metal, such as aluminum, is then deposited over the planar structure, masked, and the patterned to form metal interconnects 164 and 166, as shown in FIG. 10. Insulating material 170 is then deposited between metal interconnects 164 and 166 and the structure is again planarized so that the top surfaces of insulating material 170 and metal interconnects 164 and 166 are flush, resulting in the finished structure shown in FIG. 10.

Figure 11:
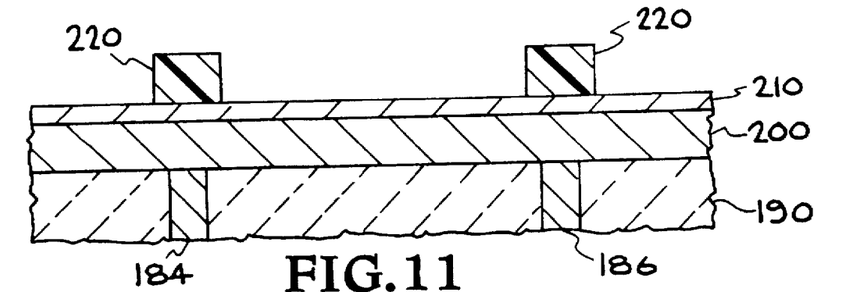
FIG. 11 is a fragmentary vertical cross-sectional view illustrating the construction of the uppermost level of metal interconnects, and therefore showing the structure of either of FIGS. 8, 9, or 10 after the formation of a metal layer over an insulation layer containing metal-filled vias with a further layer of an alloyable metal formed over the metal layer prior to the step of patterning the metal layer and the alloyable metal thereon to form the metal interconnects to facilitate bonding of the structure to a semiconductor substrate containing the integrated circuit devices.
Figure 12:
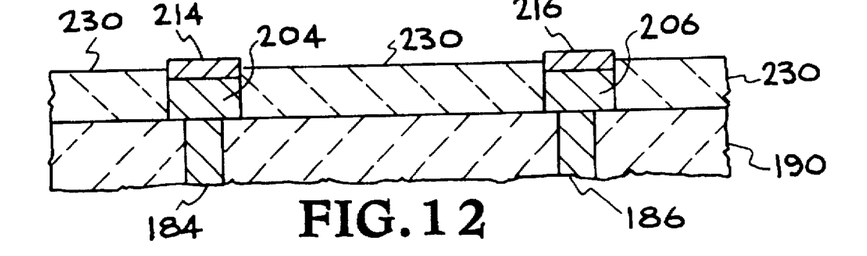
FIG. 12 is a fragmentary vertical cross-sectional view showing the structure of FIG. 11 after patterning of the metal layer and layer of alloyable metal thereon, the deposition of a further insulating layer to fill the regions where the metal layer and alloyable metal were removed, and further showing the removal of sufficient of the just deposited insulating layer to allow the upper surface of the alloyable metal to protrude above the remaining upper surface of the structure to thereby facilitate bonding of the structure to a substrate containing integrated circuit devices.
Figure 13:
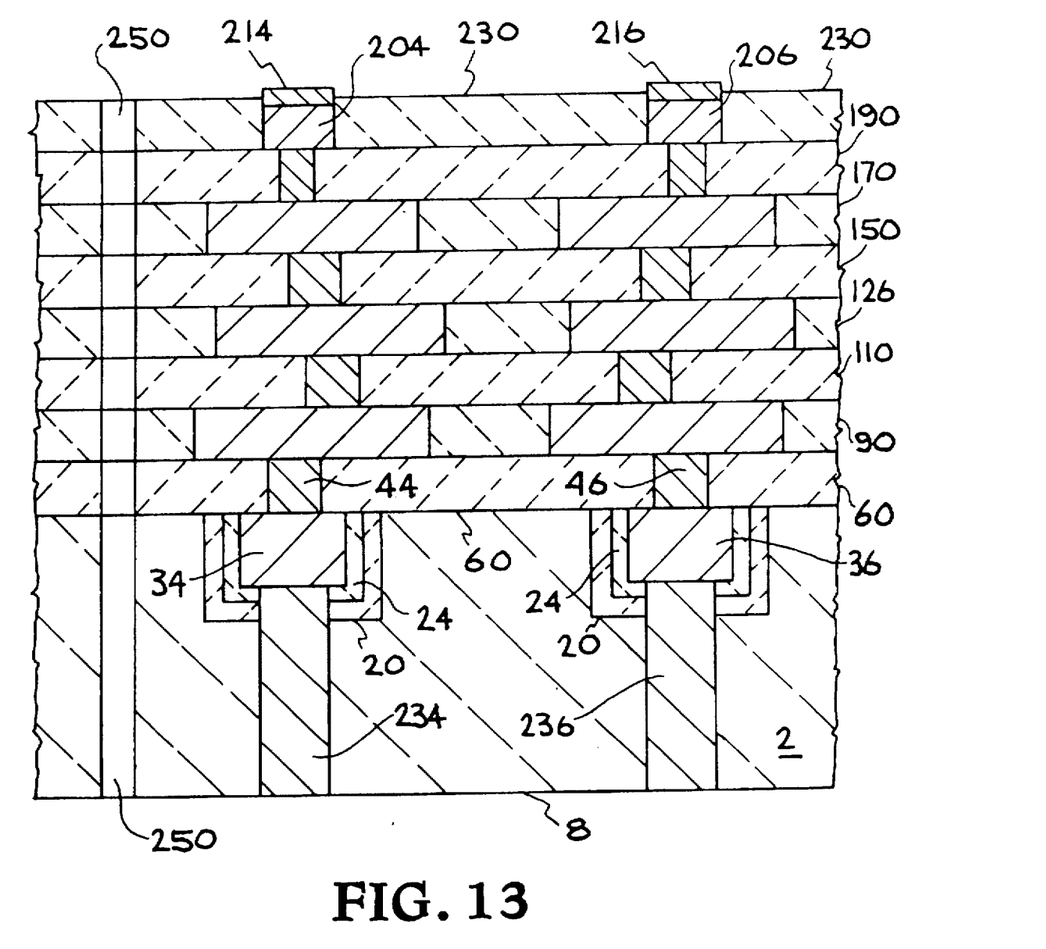
FIG. 13 is a fragmentary vertical cross-sectional view of a substrate constructed in accordance with the structures shown in FIGS. 1-12 with openings formed through the substrate from the backside to the metal contacts formed in the substrate slots, and also showing other openings formed completely through the substrate to facilitate alignment and bonding of the substrate with a semiconductor substrate having integrated circuit devices thereon to form the final integrated circuit structure.
Figure 16:
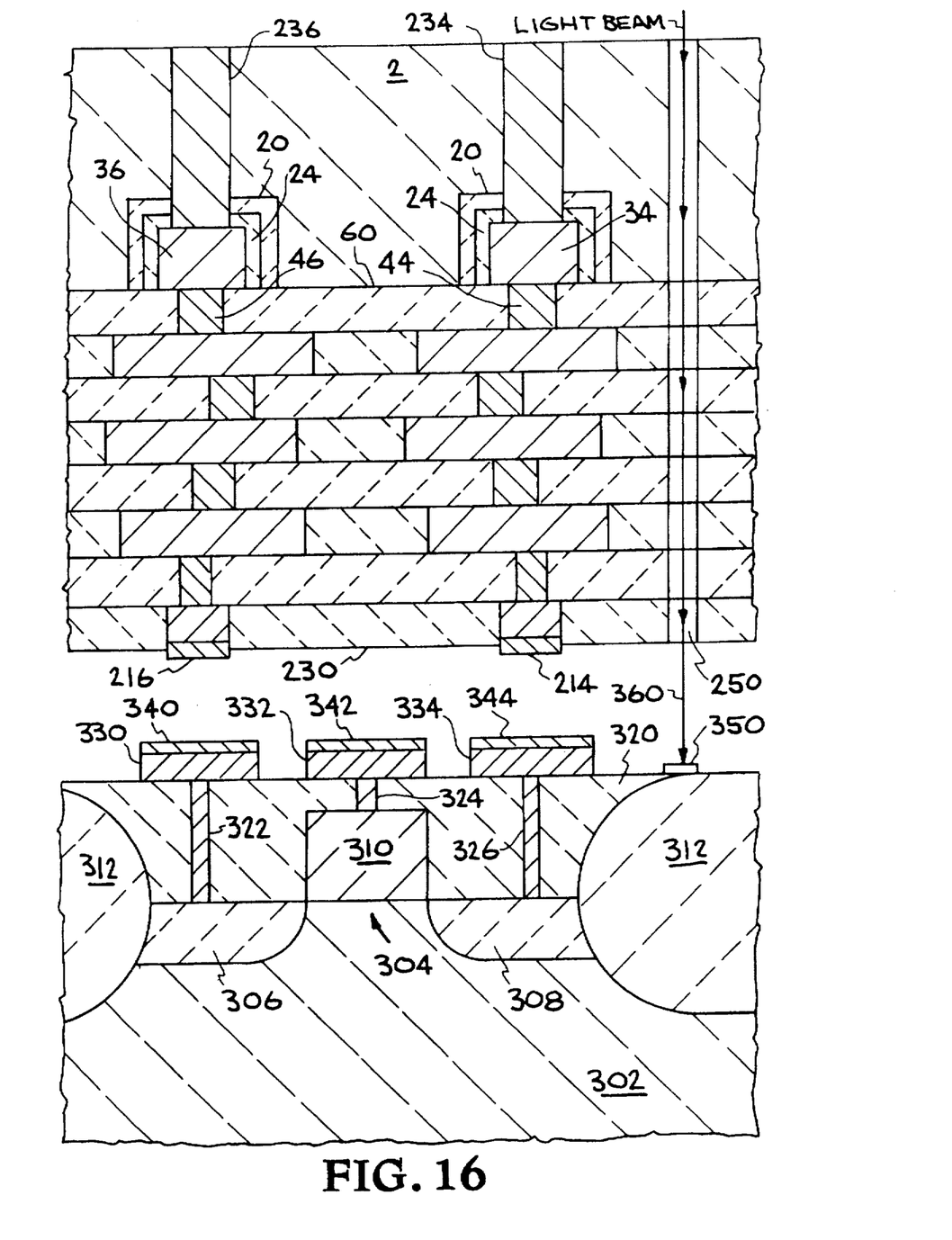
FIG. 16 is a fragmentary partially exploded vertical cross-sectional view of the substrate of FIG. 13 shown in an inverted position over the semiconductor substrate of FIG. 15 during alignment of the two substrates and just prior to the bonding of the substrates together.
Figure 17:
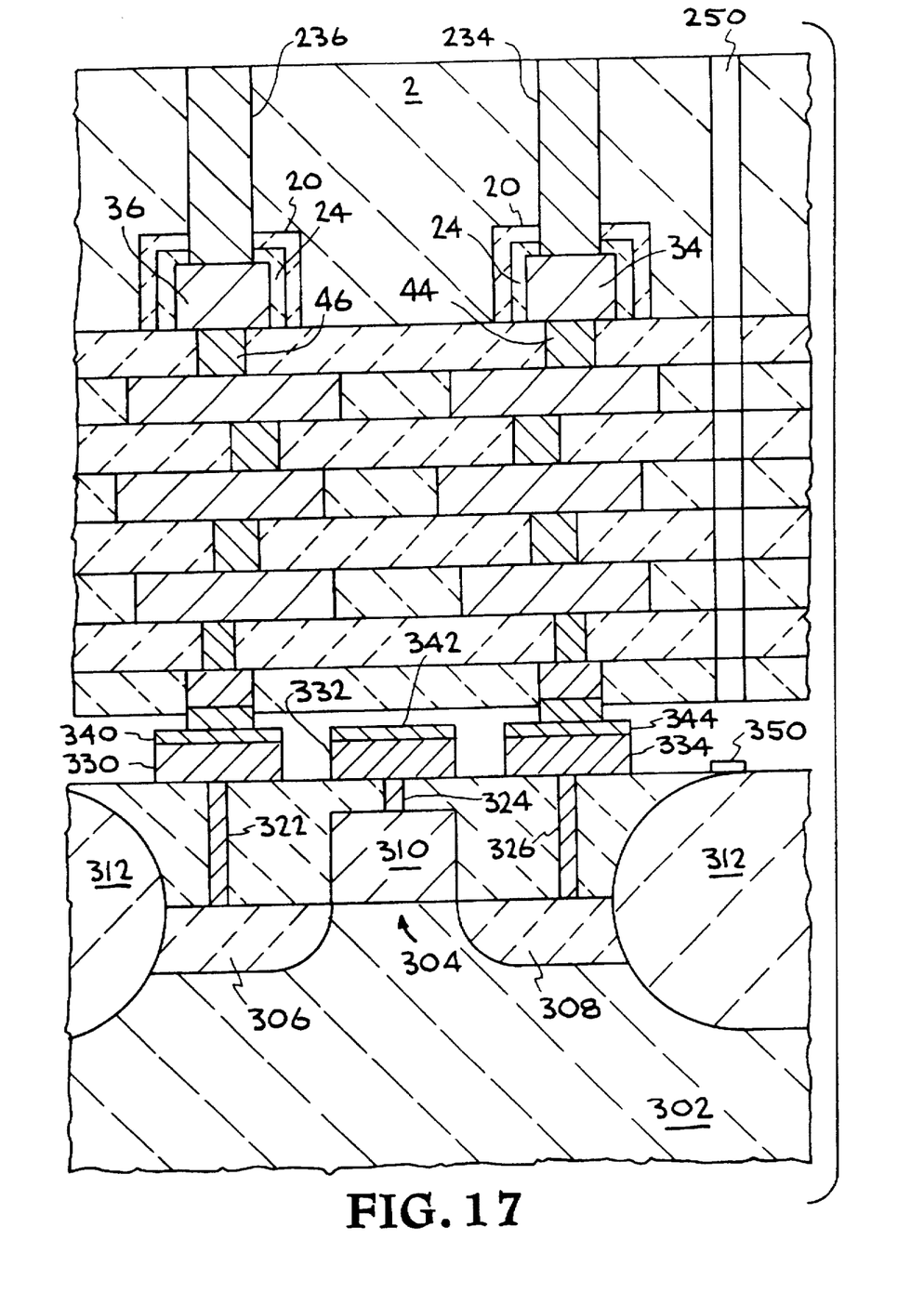
FIG. 17 is a fragmentary vertical cross-sectional view showing the metal interconnect substrate and the semiconductor substrate bonded together.

FIGS. 11–13 show the formation of the final contact layer which, when the structure is inverted to attach it to a substrate containing integrated circuit devices, will become the lowest layer of the metal interconnect structure shown in FIG. 13, as well as in FIGS. 16–17. Turning to FIG. 11, metal-filled vias 184 and 186 are formed in the same manner as previously described with respect to metal-filled vias 44–46, 104–106, and 144–146, with insulation material 190 shown around metal-filled vias 184 and 186. As in the formation of the previous metal interconnect layers, a metal layer 200, such as aluminum, is then deposited over insulation material 190 and over the top surfaces of metal-filled vias 184 and 186. However, in the formation of this final contact layer, a further metal layer 210, comprising a low temperature alloyable metal such as, for example, gold or palladium, is then deposited over metal layer 200 prior to forming mask 220 thereon, and therefore, prior to the patterning of metal layer 200.

By use of the term "low temperature alloyable metal" is meant a metal which is capable of bonding to underlying metal layer 200 and which has a melting point lower than the melting point of the metal comprising metal layer 200. In a preferred embodiment, the term "low temperature alloyable metal" is intended to define a metal having a melting point below about 500° C. As will be explained in more detail below, the purpose of using low melting point metal layer 210 is to facilitate a low temperature metallurgical and electrical bonding of the underlying contacts to be formed from metal layer 200 with corresponding or mating metal contact surfaces on a substrate having the integrated circuit devices constructed thereon.

After formation of both metal contact layer 200 and alloyable metal layer 210 thereon over vias 184 and 186 and over insulating layer 190, mask 220 is applied over metal layer 210. Both metal layers 200 and 210 are then patterned to form metal contacts comprising metal contact 204 with alloyable metal portion or bump 214 thereon, and metal contact 206 with alloyable metal portion or bump 216 thereon. The spaces around contacts 204 and 206 are then filled by depositing further insulating material 230 over insulating layer 190, as illustrated in FIG. 12. The structure is then planarized to expose the upper surfaces of alloyable metal portions 214 and 216. However, it will be noted, in FIG. 12, that the surface of insulating layer 230 has been overetched to permit a slight protrusion of alloyable metal portions 214 and 216 above the overall surface of the structure. That is, about 500 Angstroms of additional insulating material 230 is removed after the planarization reaches the top surface of alloyable metal contacts 214 and 216 to allow protrusion of the alloyable metal by about that amount. While such overetching is not mandatory, it is preferred to facilitate the subsequent bonding of the metal interconnect substrate with the integrated circuit device substrate. This overetching may be accomplished by wet etching or plasma etching of layer 230.

Turning now to FIG. 13, after formation of the previously described metal interconnects and metal contacts in and on substrate 2, openings or holes may be formed through substrate 2 to opposite surface 8 of substrate 2 to permit electrical connects to be made to metal contacts 34 and 36 from opposite surface 8 of substrate 2. Thus, as shown in FIG. 13, holes 234 and 236 may be formed through substrate 2 to metal contacts 34 and 36 from surface 8 of substrate 2. Holes 234 and 236 may be circular in cross-section, having a diameter, for example, of about 1 micron or more. Holes 234 and 236 alternately may be formed with some other non-circular cross-section, e.g., polygonal. In addition, as also shown in FIG. 13, a plurality of openings or holes 250 may be formed completely through substrate 2 to act as orientation or alignment holes to permit subsequent alignment of substrate 2, through holes 250, with appropriate targets positioned on the surface of a substrate having integrated circuit devices formed therein to facilitate alignment and bonding together of the two substrates, as will be described below. Illustrated alignment hole or opening 250 may comprise one opening of a pattern of alignment holes generally arranged in any desired pattern to achieve the desired alignment of the two substrates.

Holes 234, 236, and 250 may be formed using a dry anisotropic etch process. Alternatively when substrate 2 has a 110 surface orientation, as previously described, a wet etchant system may also be used to form anisotropic openings 234, 236, and 250. The dry or wet etchant system is preferably chosen to be selective to the barrier layer or layers 20 and 24. This will permit substrate 2 to be etched until barrier layer 24 is reached which will act as an etch stop for holes 234 and 236, while permitting hole 250 to be completely etched through substrate 2. The etch system can then be changed to permit etching of the barrier layers, with the metal comprising metal contacts 34 and 36 then functioning as an etch stop for the etching of barrier layers 20 and 24.

For example, when substrate 2 comprises a silicon substrate, first barrier layer 20 comprises silicon oxide ($SiO_2$), second barrier layer 24 comprises titanium nitride, and metal contacts 34 and 36 comprise aluminum, a dry etchant system, e.g., a chlorine plasma, or an anisotropic wet etchant system, may be used to etch the silicon substrate to form holes 234, 236, and 250. Silicon oxide barrier layer 20 will act as an etch stop for these etchant systems. The dry etchant will then be changed to $CF_4$ plasma to etch silicon oxide barrier layer 20, and then changed to a chlorine plasma to then etch titanium nitride barrier layer 24 (if second barrier layer 24 is present), stopping at aluminum contacts 34 and 36. If a wet etchant system is used, an HF-based etchant may be used to etch silicon oxide barrier layer 20 and a $NH_4OH/H_2O_2$ etchant may be used to etch titanium nitride barrier layer 24, with the later etchant stopping at aluminum metal contacts 34 and 36. It should be noted that when substrate 2 comprises a material other than an insulating material, lining of holes 234 and 236 with insulating material may be necessary. For example, when substrate 2 is a single crystal silicon semiconductor substrate, holes 234 and 236 may be lined with silicon oxide. The original diameter of holes 234 and 236 will then be adjusted accordingly to compensate for the reduced cross-section after formation of the oxide lining therein.

Figure 14:
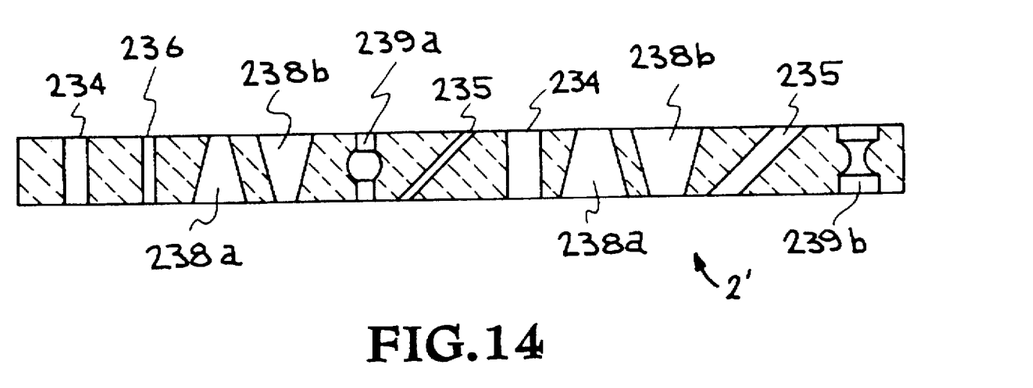
FIG. 14 is a fragmentary vertical cross-sectional view illustrating other embodiments of the openings in the substrate of FIG. 13, showing various other shapes of the openings extending either partially or fully through the substrate.

FIG. 14 shows alternate embodiments of the shapes and sizes of the openings or holes 234, 236, and 250 formed in substrate 2 previously described with respect to FIG. 13. Thus, substrate 2' may be formed with perpendicular holes 234 and 236, as previously described (i.e., having a center axis perpendicular to the plane of the surface of substrate 2'), of varying diameters (or cross-sections); or with an angled opening 235 having a center axis formed at an acute angle with respect to the plane of the surface of substrate 2'. Substrate 2' may also be formed with tapered or conical holes 238a or 238b formed therein, or patterned holes (holes having a portion of enlarged or restricted diameter spaced from both ends of the hole) such as illustrated at 239a and 239b.

Such openings of various shapes and sizes may be formed by various combinations of anisotropic and isotropic etching, such as various forms of dry or wet etching, and which may further include selective implantation of the substrate to vary the response of the substrate to such etching systems. Additionally, shaped holes, including holes through the substrate, may be formed by including a dissolvable material in a matrix with subsequent dissolution. A suitable dissolvable material usable to make various openings or holes may be fullerenes such as Buckminster fullerenes, or other forms of carbon, including doped carbon.

It should also be noted that the formation of such holes or openings of various shapes through the substrate may provide additional or other utility than that of either alignment or providing an electrical connection to a metal contact in or on the opposite surface of the substrate. For example, such openings may provide an increased gettering effect, may provide channels for the circulation of coolant in contact with the substrate; may result in a reduction of the overall weight of the substrate; may provide potentially better heat dissipation; and may provide a more controlled thermal expansion of the substrate by the patterns of the holes. Furthermore, such holes could be formed from the backside surface of a substrate on which integrated circuit structures had been formed to reach contact regions from the backside of the substrate for test purposes, in which case such holes could subsequently be filled with other material, e.g., an insulating material.

Figure 15:
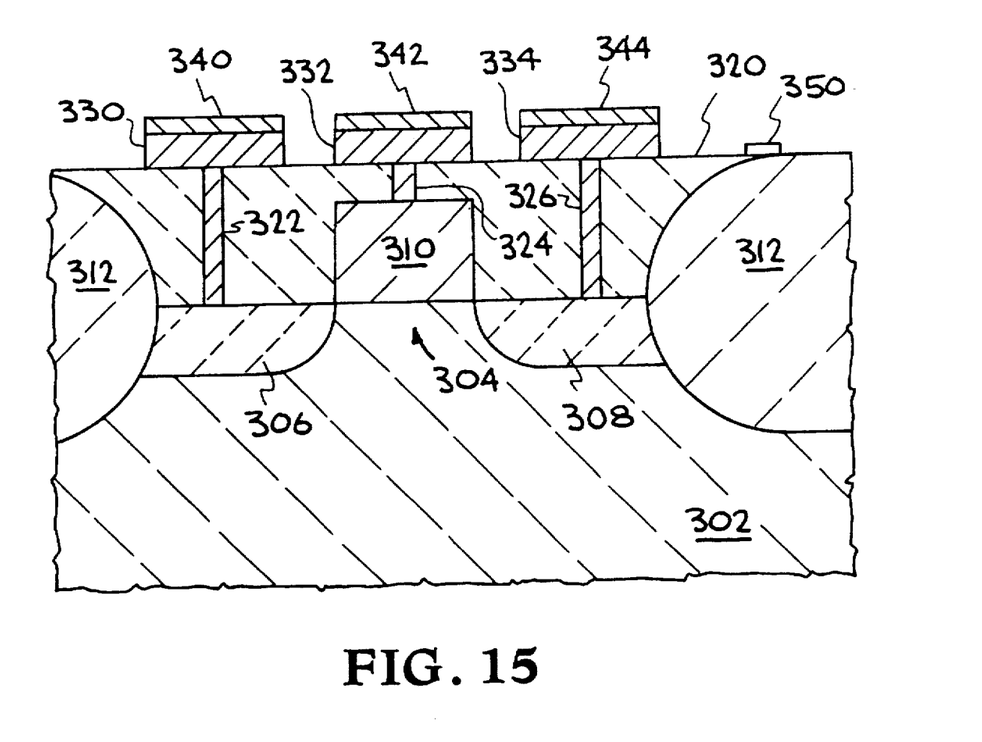
FIG. 15 is a fragmentary vertical cross-sectional view of a semiconductor substrate having semiconductor devices previously formed therein with a modified surface structure to provide raised bumps of alloyable metal thereon, as well as targets formed on the surface, to respectively facilitate bonding and alignment of the semiconductor substrate with the metal interconnect substrate of FIG. 13.

FIG. 15 illustrates a semiconductor substrate 302, e.g., a silicon wafer, having conventional integrated circuit devices formed thereon such as illustrated MOS device 304 located between field oxide portions 312 (which electrically isolate the MOS device from adjacent devices) and comprising a source region 306, a drain region 308 and a gate electrode 310. An insulating layer 320, such as a silicon oxide ($SiO_2$) layer, is then formed over the active regions and electrodes and preferably planarized down to a level above gate electrode 310. Contact openings 322, 324, and 326 are then respectively formed, e.g. etched, in insulating layer 320 respectively down to source region 306, gate electrode 310, and drain region 308. A first metal layer is then formed over the structure which will also fill up openings 322, 324, and 326, e.g., tungsten. If needed or desired, a conductive layer of a barrier material such as titanium nitride may first be formed in openings 322, 324, and 326 before deposition of a metal layer such as tungsten. After formation of the metal layer which fills openings 322, 324, and 326, a thin alloyable metal layer (solder layer) of, for example, from about 0.1 to about 0.5 microns is formed over the first metal layer. Both metal layers are then masked and patterned to form alloyable metal contacts 340, 342, and 344 over metal contacts 330, 332, and 334, as shown in FIGS. 15–17.

Alloyable metal contacts 340 and 344 on semiconductor substrate 302 are formed in registry with previously described alloyable metal contacts 214 and 216 on substrate 2 so that the respective contacts may be bonded together, as will be described below.

To assist in alignment of the respective contacts on the substrates, a plurality of targets such as illustrated target 350 are formed on the surface of semiconductor substrate 302 in registry with a plurality of openings or holes in substrate 2 such as illustrated and previously described opening 250.

After completion of the formation of the metal interconnects structures on substrate 2, including alloyable metal contacts 214 and 216, and completion of the integrated circuit structures on semiconductor substrate 302, including alloyable metal contacts 340, 342, and 344, the two substrates may be aligned, and then metallurgically joined together, as illustrated in FIGS. 16 and 17. Thus, a coherent light beam 360, as shown in FIG. 16, preferably a laser beam, may be shined through opening 250 in substrate 2 onto target 350 on substrate 302, and either substrate 2 or substrate 302 then moved appropriately until beam 360 is in the middle of target 350. By use of multiple openings 250 and multiple targets 350, precise two dimensional alignment of substrates 2 and 302 may be achieved and the two substrate may then be placed in contact with one another, as shown in FIG. 17. The two substrates are then heated to the melting point of alloyable metal contacts 214, 216, and 340, 342, and 344, e.g., about 400° C., and then maintained at that temperature for a time period sufficient to metallurgical bond the metal contacts together, i.e. usually for just a few seconds.

After bonding of the two substrates together, the substrates may be cut, i.e., diced, into individual chips or dies to which wire leads are attached through metal-filled contact vias 234 and 236 on surface 8 of substrate 2, and the structure then is conventionally packaged, i.e., encapsulated in an appropriate material. It should be noted that if desired, larger area contacts may be formed on surface 8 in electrical communication with metal-filled vias 234 and 236 and such contacts could then be arranged in any desired manner, e.g., throughout the entire area of surface 8 or around the periphery of the structure.

Thus, the invention provides a structure and process of making same wherein an integrated circuit die is constructed in two parts with the integrated circuit devices formed in a semiconductor substrate, and the metal wiring, i.e., contacts, vias, and metal interconnects, are formed in and on one surface of a second substrate, after which contact holes or openings are formed which extend from the metal wiring structure on one surface through the second substrate to the opposite surface where metal leads may be attached after the two substrates have been bonded together and cut into individual dies or chips. Various configurations of holes or openings which extend either partially or totally through the second substrate are described and illustrated which can be used for providing electrical communication to the opposite surface of the substrate and to facilitate alignment of the respective substrates, as well as to serve ancillary or alternate functions.

Having thus described the invention what is claimed is:

1. A process for forming an integrated circuit structure comprising a plurality of individual integrated circuit devices constructed on and in a first semiconductor substrate and at least one layer of metal interconnects constructed on and in a second semiconductor substrate, which comprises:
    a) forming a plurality of individual integrated circuit devices on said first semiconductor substrate;
    b) forming metal contacts electrically connected to said individual integrated circuit devices on said first semiconductor substrate;
    c) forming at least one layer of metal interconnects on said second semiconductor substrate;
    d) aligning portions of said metal interconnects on said second semiconductor substrate with said metal contacts on said first semiconductor substrate by the steps of:
        i) forming one or more alignment targets positioned on the surface of said first semiconductor substrate;
        ii) anisotropically etching one or more openings through said second substrate to permit subsequent alignment of said first and second semiconductor substrates; and
        iii) shining a light beam through said opening in said second semiconductor substrate onto said target on said first semiconductor substrate to thereby align said first and second semiconductor substrates; and
    e) then metallurgically connecting said aligned portions of said metal interconnects on said second semiconductor substrate with said metal contacts on said first semiconductor substrate; to thereby provide electrical interconnection of said plurality of individual integrated circuit devices on said first semiconductor substrate with said metal interconnects on said second semiconductor substrate to provide said integrated circuit structure.

2. The process of forming an integrated circuit structure of claim 1 wherein said step of forming at least one layer of metal interconnects on said second semiconductor substrate further comprises forming at least one layer of metal interconnects on said second semiconductor substrate having a thickness not exceeding about 500 microns.

3. The process of forming an integrated circuit structure of claim 1 wherein said step of forming at least one layer of metal interconnects on said second semiconductor substrate further comprises forming said layer of metal interconnects on one surface of said second semiconductor substrate which is subsequently bonded to said first semiconductor substrate; and which includes the further step of forming metal-filled openings through said second semiconductor substrate from said metal interconnects formed in said one surface to an opposite surface thereof to permit attachment of metal leads to said metal-filled openings in said opposite surface of said second semiconductor substrate.

4. The process of forming an integrated circuit structure of claim 1 which includes the further steps of forming low temperature alloyable metal contacts on surfaces of said first and second semiconductor substrates to facilitate said step of bonding said first and second semiconductor substrates together.

5. The process of forming an integrated circuit structure of claim 4 which includes the further step of aligning said low temperature alloyable metal contacts on said surface of said first semiconductor substrate with said low temperature alloyable metal contacts on said surface of said second semiconductor substrate.

6. The process of forming an integrated circuit structure of claim 1 which includes forming said second semiconductor substrate with at least two of said layers of metal interconnects by the further steps of:
  a) forming a layer of metal-filled vias over said one layer of metal interconnects; and
  b) forming a second layer of metal interconnects over said layer of metal-filled vias.

7. The process of forming an integrated circuit structure of claim 6 which includes forming said second semiconductor substrate with at least two of said layers of metal interconnects by the steps of:
  a) forming a metal layer over said first layer of said metal interconnects;
  b) patterning said metal layer to form columns of metal;
  c) forming insulating material around said columns of metal to thereby form said metal-filled vias from said columns of metal; and
  d) forming another layer of metal interconnects over said metal-filled vias.

8. The process of claim 1 wherein said step of forming metal contacts electrically connected to said individual integrated circuit devices on said first semiconductor substrate further includes forming low temperature alloyable metal contacts on said first semiconductor substrate to facilitate said subsequent step of metallurgically connecting said metal contacts on said first semiconductor substrate with said metal contacts on said second semiconductor substrate.

9. The process of claim 1 wherein said step of forming at least one layer of metal contacts on said second semiconductor substrate further includes forming low temperature alloyable metal contacts on said second semiconductor substrate to facilitate said subsequent step of metallurgically connecting said metal contacts on said first semiconductor substrate with said metal contacts on said second semiconductor substrate.

10. A process for forming a metal interconnect semiconductor substrate suitable for bonding to a second semiconductor substrate having a plurality of semiconductor devices formed thereon to provide electrical connects between said plurality of semiconductor devices through metal interconnects on said metal interconnect semiconductor substrate, said process for forming said metal interconnect semiconductor substrate comprising the steps of:
  a) forming at least one layer of metal interconnects in a first surface of said metal interconnect semiconductor substrate;
  b) forming a layer of low temperature alloyable metal over exposed metal surfaces of said at least one layer of metal interconnects; and
  c) anisotropically forming at least one alignment opening through said metal interconnect semiconductor substrate to permit alignment of said metal interconnect semiconductor substrate to said second semiconductor substrate during subsequent bonding of said first and second semiconductor substrates to one another.

11. The process for forming a metal interconnect semiconductor substrate suitable for bonding to said second semiconductor substrate of claim 10 wherein said step of forming said at least one layer of metal interconnects in said metal interconnect semiconductor substrate further comprises forming said at least one layer of metal interconnects in said metal interconnect semiconductor substrate having a thickness not exceeding about 500 microns.

12. The process for forming said metal interconnect semiconductor substrate suitable for bonding to said second semiconductor substrate of claim 11 which includes the further step of forming metal-filled openings through said metal interconnect semiconductor substrate from said metal interconnects formed in said first surface to an opposite surface thereof to permit attachment of metal leads to said opposite surface of said metal interconnect semiconductor substrate.

13. The process for forming a metal interconnect semiconductor substrate suitable for bonding to said second semiconductor substrate of claim 10 wherein said step of forming said at least one layer of metal interconnects in said metal interconnect semiconductor substrate further comprises the steps of:
  a) forming a plurality of slots in one surface of said metal interconnect semiconductor substrate generally perpendicular to the plane of said surface of said metal interconnect semiconductor substrate;
  b) forming a barrier layer over the surfaces of said slots;
  c) forming a metal layer over said metal interconnect semiconductor substrate which fills said slots with said metal; and
  d) planarizing said structure to remove portions of said metal layer not in said slots.

14. The process for forming a metal interconnect semiconductor substrate suitable for bonding to said second semiconductor substrate of claim 10 wherein at least two layers of metal interconnects are formed in said metal interconnect semiconductor substrate by the steps of:
  a) forming a layer of metal-filled vias over said one layer of metal interconnects; and
  b) forming a second layer of metal interconnects over said layer of metal-filled vias.

15. The process for forming said metal interconnect semiconductor substrate suitable for bonding to said second semiconductor substrate of claim 14 wherein said layer of low temperature alloyable metal is formed over exposed metal surfaces of the outermost of said two layers of metal interconnects.

16. The process for forming said metal interconnect semiconductor substrate suitable for bonding to said second semiconductor substrate of claim 15 wherein said metal-filled vias are formed in between said two layers of metal interconnects on said metal interconnect substrate by the steps of:

a) forming a metal layer over a first of said two layers of said metal interconnects;

b) patterning said metal layer to form columns of metal;

c) forming insulating material around said columns of metal to thereby form said metal-filled vias from said columns of metal; and     d) forming the second of said two layers of metal interconnects over said metal-filled vias.

17. A process for forming an integrated circuit structure wherein a plurality of individual integrated circuit devices are constructed on and in a first semiconductor substrate and metal interconnects are constructed on and in a second semiconductor substrate subsequently bonded to said first semiconductor substrate, whereby the defect rate of semiconductor chips formed from said bonded together semiconductor substrates is capable of being lowered by reducing the number of processing steps carried out on a single substrate which comprises:

a) forming a plurality of individual integrated circuit devices on said first semiconductor substrate;

b) forming low temperature alloyable metal contacts on said first semiconductor substrate electrically connected to said individual integrated circuit devices on said first semiconductor substrate;

c) forming one or more alignment targets positioned on the surface of said first semiconductor substrate;

d) forming at least one layer of metal interconnects on said second semiconductor substrate having low temperature alloyable metal contacts thereon;

e) anisotropically etching one or more alignment openings through said second semiconductor substrate to permit subsequent alignment of said first and second semiconductor substrates through said alignment openings;

f) shining a light beam through said alignment opening in said second semiconductor substrate onto said target on said first semiconductor substrate;

g) moving one of said first and second semiconductor substrates until said light beam is in the middle of said target to thereby align said first and second semiconductor substrates; and     e) then metallurgically connecting said aligned first and second semiconductor substrates through said low temperature alloyable metal contacts on said first semiconductor substrate and said low temperature alloyable metal contacts on said second semiconductor substrate; to thereby provide electrical interconnection of said plurality of individual integrated circuit devices on said first semiconductor substrate with said metal interconnects on said second semiconductor substrate to provide said integrated circuit structure after formation of said plurality of individual integrated circuit devices on said first semiconductor substrate, and after formation of metal interconnects on said second semiconductor substrate, whereby defects may be independently ascertained on either of said first and second semiconductor substrates before said metallurgical connecting step.

\* \* \* \* \*